United States Patent [19]

Nishizawa

[11] Patent Number: 4,569,828
[45] Date of Patent: Feb. 11, 1986

[54] CRYSTAL PULLING APPARATUS FOR MAKING SINGLE CRYSTALS OF COMPOUND SEMICONDUCTORS CONTAINING A VOLATILE COMPONENT

[75] Inventor: Minoru Nishizawa, Tokyo, Japan
[73] Assignee: Gakei Electric Works Co., Ltd., Tokyo, Japan
[21] Appl. No.: 675,404
[22] Filed: Nov. 27, 1984
[51] Int. Cl.[4] ............................................. C03B 15/30
[52] U.S. Cl. .............................. 422/249; 156/617 SP; 156/DIG. 98; 308/10
[58] Field of Search .................. 422/249; 156/617 SP, 156/DIG. 98; 308/10

[56] References Cited

U.S. PATENT DOCUMENTS

| | | | |
|---|---|---|---|
| 3,856,200 | 12/1974 | Lieb | 308/10 X |
| 4,284,605 | 8/1981 | Pierrat | 156/617 SP |
| 4,371,218 | 2/1983 | Ichikawa | 308/10 |

FOREIGN PATENT DOCUMENTS

| | | | |
|---|---|---|---|
| 193943 | 12/1957 | Austria | 422/249 |
| 2362825 | 6/1975 | Fed. Rep. of Germany | 156/617 SP |

*Primary Examiner*—Robert Lindsay
*Attorney, Agent, or Firm*—Fleit, Jacobson, Cohn & Price

[57] ABSTRACT

In a high pressure vessel such as an electric furnace using an inert gas of an extremely high pressure as an atmosphere for preventing the evaporation of arsenic or phosphorus when pulling a single crystal of a compound semiconductor having a high melting point and exhibiting a high dissociation pressure at the melting point, such as a III-V Group compound semiconductor, e.g. GaAs or GaP from a feed melt contained in a crucible, it is intended to rotate and vertically move a crucible supporting shaft and a single crystal pulling shaft smoothly without impairing at all the gas-tightness in the furnace, the drive means utilizing a magnetic force for performing such rotational and vertical movements. In order to mount rotating and vertically moving mechanisms of the moving shafts in an extremely limited space of the vessel to permit easy assembly and disassembly, there are provided plural cylinders enclosing these mechanisms, each consisting of axially removably connected tubular bodies of a thin-walled small diameter. The above rotating and vertically moving mechanisms are incorporated in the interior of those cylinders. Additionally, a weight measuring means is provided. All parts are in a hermetically sealed state.

7 Claims, 4 Drawing Figures

CRYSTAL PULLING APPARATUS FOR MAKING SINGLE CRYSTALS OF COMPOUND SEMICONDUCTORS CONTAINING A VOLATILE COMPONENT

BACKGROUND OF THE INVENTION

1. Field of the Invention

The present invention relates to a crystal pulling apparatus for obtaining a single crystal of a compound semiconductor material containing a volatile component as one constituent thereof such as gallium arsenide (GaAs), gallium phosphide (GaP), or indium phosphide (InP).

2. Description of the Prior Art

GaAs, GaP and InP melt at 1238°, 1470° and 1050° C. and have dissociation pressures as high as 0.9, 30 and 15.5 atm at such melting points, respectively. Therefore, when pulling single crystals of these compound semiconductors according to the Czochralski method, a technique has been developed in which the upper surface of the feed melt is covered with a liquid sealing agent such as, for example, $B_2O_3$ for preventing the evaporation of arsenic (As) or phosphorous (P), and the feed melt is contained in an inert gas atmosphere of an extremely high pressure, namely, from several tens to several hundreds of atmospheres.

The feed melt usually is prepared by re-melting a polycrystalline material, but the method of preparing a feed melt directly from elemental components in the same production apparatus and subsequently pulling a single crystal is more time-saving and, so, has often been tried. In such instances, since the volatile components As and P have a vapor pressure which increases exponentially with increasing temperature, an inert gas atmosphere of a higher pressure is sometimes necessary in order to prevent the evaporation of such components.

As is well appreciated, when pulling a single crystal, it is necessary to rotate and vertically move the crucible which contains the feed melt and also to rotate and vertically move the single crystal pulling shaft which has a seed crystal attached to its lower or melt-contacting end. In conducting such processes and in the use of such apparatus for pulling up single crystals of such compound semiconductors, a major technical problem that must be dealt with and solved is how to rotate and vertically move smoothly a crucible supporting shaft and a single crystal pulling shaft without impairing the gas-tightness (hermetic seal) of the high pressure furnace in which the process is being carried out.

Further, since the liquid level lowers as the single crystal pulling operation progresses, it becomes impossible to see the interior of the crucible. It is necessary therefore, to provide a device for measuring the weight of either the single crystal being pulled or the crucible with residual feed melt in order to know to what extent the crystal pulling operation has advanced. In the past the technical difficulties of how to provide a measuring device and how to incorporate same in the crystal pulling apparatus have not been adequately solved.

The use of drive means utilizing a magnetic force for transmitting a driving force from the exterior of an electric furnace which requires gas-tightness is generally well known in the art. However, such known drive means have been all developed in association with low pressure systems. Also, such known drive means provide for either rotational movement or vertical (axial) movement, but not both. A need still exists for an effective means utilizing a magnetic force for transmitting to a single shaft located in an electric furnace (a high pressure vessel which is held in a state of an extremely high pressure from several tens to several hundreds of atmospheres) both rotating and vertically moving drive forces.

It is a primary object of the present invention to provide apparatus for pulling a single crystal of a compound semiconductor which includes a means for transmitting both a rotational drive force and a vertical movement drive force to both a crucible supporting shaft and a single crystal pulling shaft positioned within a high pressure vessel (an electric furnace held at an extremely high pressure) without impairing the gas-tightness (hermetic seal) of the pressure vessel.

It is another object of the present invention to provide apparatus for pulling a single crystal of a compound semiconductor which includes drive means for rotating and vertically moving a shaft which are arranged extremely efficiently in an enclosed cylinder of extremely small diameter.

It is a further object of the present invention to provide apparatus for pulling a single crystal of a compound semiconductor which includes effective means for measuring the weight of the single crystal or the crucible and residual feed melt without impairing at all the gas-tightness (hermetic seal) of the furnace which is being held at high pressure.

The above and other objects, features and advantages of the invention will become clear from the following description of the preferred embodiment taken in conjunction with the accompanying drawings.

DESCRIPTION OF A PREFERRED EMBODIMENT

An embodiment of the present invention will be described in detail hereinafter with reference to the accompanying drawings.

Figure 1:
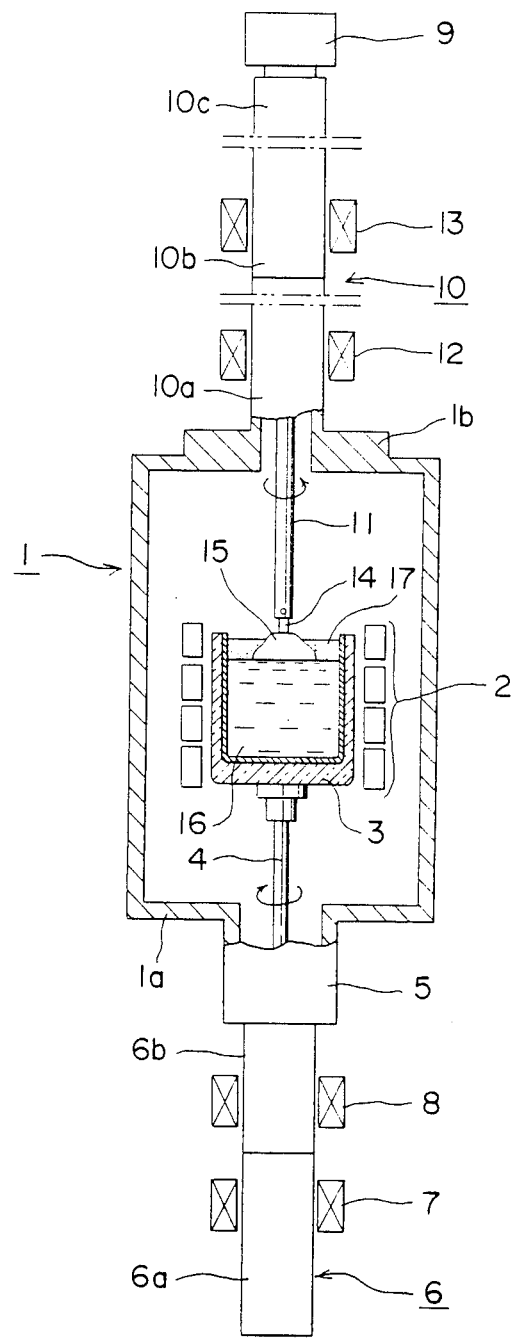
FIG. 1 is a schematic view illustrative of the present invention.

FIG. 1 is a schematic illustration of the present invention, and shows a conventional inductive heating means 2 provided in the interior of a pressure-resistant electric furnace 1 made of, for example, stainless steel. A graphite crucible 3 having a quartz liner 3a is disposed in the interior of the furnace, appropriately surrounded by the heating means 2. The crucible 3 is located and fixed on the upper end of a crucible supporting shaft 4. The crucible supporting shaft 4 projects through an opening 1c formed in bottom cover 1a at the bottom of the furnace 1 and is enclosed in a thin-walled, small diameter, lower cylinder 6 of a completely closed structure. Cylinder 6 is suspended in hermetically sealed fashion downwardly from the bottom of a holding cylinder 5 hermetically attached to the bottom cover 1a of the electric furnace 1. Shaft 4 is adapted to be vertically (axially) moved and rotated by a drive means 7 to effect vertical movement, and a drive means 8 to effect rotational movement. Drive means 7 and 8 are mounted inside and outside the lower cylinder 6 and utilizing magnetic force to transmit non-invasively the required driving forces from the exterior to the interior of the cylinder 6 thereby preserving the gas-tightness (hermetic seal) of cylinder 6.

Attached to or erected on top cover 1b of the electric furnace 1 is a thin walled, small diameter, upper cylinder 10 of a completely closed structure. Housed in gas-tightness (hermetic seal), a weight measuring means 9, such as, for example, a conventional load cell, is attached to the upper portion of the cylinder 10. The interior of the upper cylinder 10 receives and encloses a single crystal pulling shaft 11 which projects through an opening 1d formed in top cover 1b of the furnace 1. Shaft 11 is adapted to be rotated and vertically moved by a drive means 12, to effect rotation, and a drive means 13, to effect vertical (axial) movement. Both drive means 12 and 13 are mounted inside and outside the cylinder 10 and utilize magnetic force to transmit non-invasively the required driving forces from the exterior to the interior of the cylinder 10 thereby preserving the gas-tightness (hermetic seal) of cylinder 10.

A growing single crystal 15 of, for example, GaAs adheres to a seed crystal 14 fixed to the lower free end or fore end of the single crystal pulling shaft 11. The seed crystal 14 is suspended in appropriate spacial relationship to the feed melt 16 contained in the crucible 3, and as the seed crystal 14 is pulled up from the GaAs feed melt 16 through a liquid sealing agent 17 of, for example, $B_2O_3$, single crystal 15 grows. Since the technology of crystal growth by this procedure is well known to those of ordinary skill in this art, there is no need to include same here.

Figure 2:
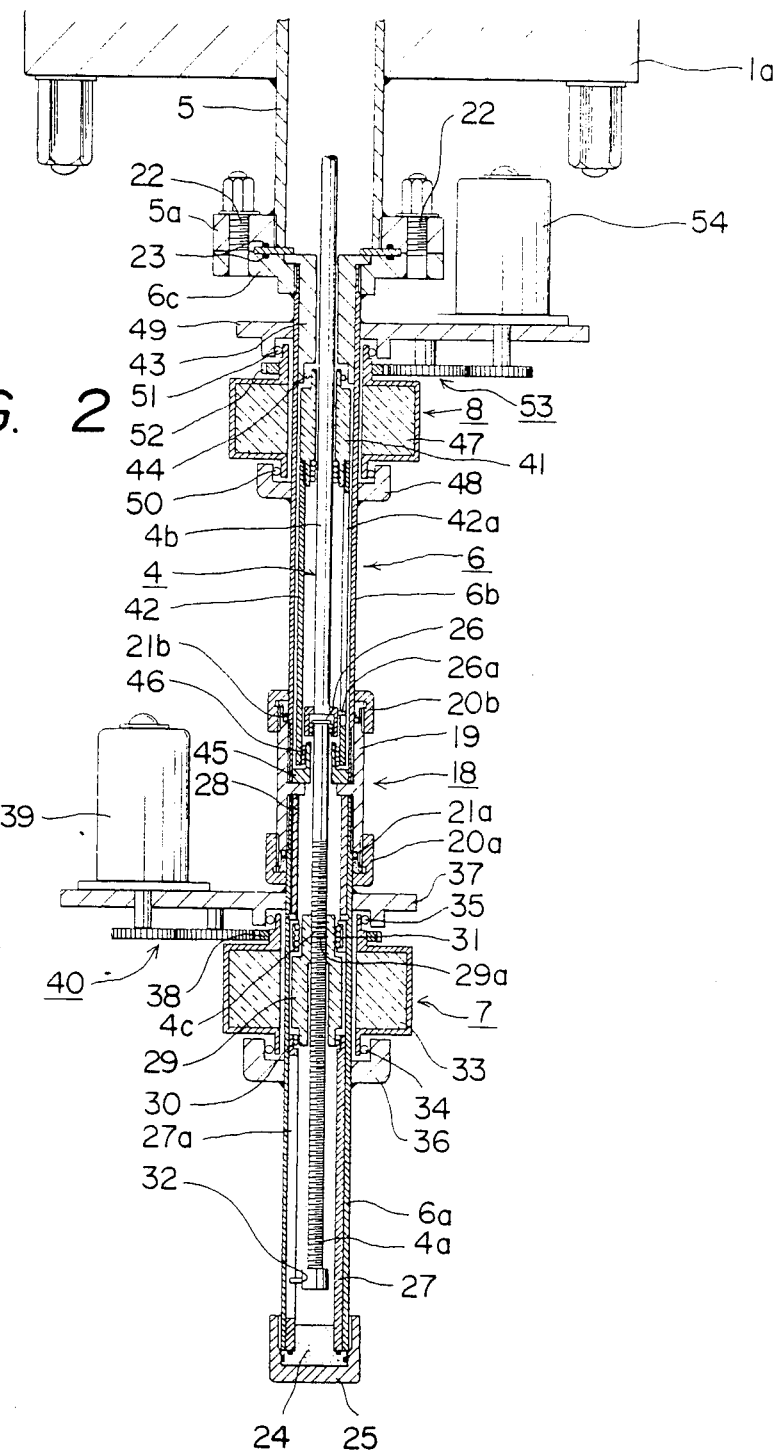
FIG. 2 is a longitudinal sectional view of a lower cylinder portion attached to an electric furnace.

Referring now to FIG. 2, the drive mechanism for shaft 4 in lower cylinder 6 will be explained. The lower cylinder 6 comprises tubular bodies 6a and 6b which are axially opposed to each other and coupled hermetically and removably from each other by a coupling means 18. The coupling means 18 comprises a connecting pipe 19 threadedly connected to the exterior of tubular bodies 6a and 6b, and clamp rings or caps 20a and 20b which are threadedly fitted on the exterior connecting pipe 19. By tightening the clamp rings 20a and 20b, packings 21a and 21b including O-rings interposed between the connecting pipe 19 and the tubular bodies 6a and 6b are appropriately compressed to isolate (hermetically seal) the interior of the tubular bodies 6a and 6b from the outside air. The pipe 19 is formed with an integral internal annular shoulder or ring 19a radially projecting inwardly from its inside surface. The tubular body 6b has welded to its upper end a flange portion 6c. Bolts 22 connect flange portion 6c to flange portion 5a of the holding cylinder 5 welded to and suspended from the bottom cover 1a. Annular ring or washer 22a is trapped between and fixed by flange portions 6c and 5a. Packings 23 disposed between the flanges 6c and 5a and ring 22a provide the requisite hermetic seal. At the other end of cylinder 6, a plug 24 is fitted in the lower end of the tubular body 6a and is compressed by a cap nut 25 threadedly connected to the exterior of body 6a. Appropriate seals 24a are provided to effect hermetic sealing. By the arrangement described, the lower cylinder 6 is completely and hermetically sealed and isolated from the outside air, thereby being held at the same pressure as that present in the electric furnace 1. Even when this internal pressure is very high, the lower cylinder 6 can fully withstand it because its diameter is extremely small, substantially smaller than the diameter of furnace.

The crucible supporting shaft 4 enclosed in the lower cylinder 6 comprises a vertically axially movable shaft 4a and a rotatable shaft 4b which also must experience axial movement. The shafts 4a and 4b are coupled together by, for example, a conventional thrust ball bearing coupling 26 at the lower end of the tubular body 6b.

The non-invasive drive means 7 for driving the vertically axially movable shaft 4a is composed of a magnet 29 located inside the tubular body 6a and supported for rotation by bearings 30 and 31 which are mounted, respectively on a lower support cylinder 27 and an upper sleeve 28. Lower support cylinder 27 is held by plug 24 at its lower end and sleeve 28 is engaged with ring 19a at its upper end. The ends of magnet 29 are of reduced section to accommodate the mounting of the bearings 30 and 31. The magnet 29 has an internally threaded portion 29a which is in threaded engagement with an externally threaded portion 4c formed on the vertically axially movable shaft 4a. Further, a sliding key 32 formed on cap 32a attached to the lower end portion of the vertically movable shaft 4a, is inserted or received into an axially formed guide slot 27a defined by the lower support cylinder 27.

Preferably, the internal thread portion 29a of magnet 29 is formed as a separate element and attached to the inside magnet 29. The tubular body 6a is surrounded with an outside magnet 33 in alignment with the inside magnet 29. The outside magnet 33 is mounted rotatably between bearing members 36 and 37 mounted as by welding on the tubular body 6a, through ball bearings 34 and 35 which are mounted on lower and upper end portions of the outside magnet 33. To a shaft portion of the outside magnet 33 is fixed a gear 38 which is rotated by a drive motor 39 carried on bearing member 37 through a drive force transmitting means 40 which comprises appropriate gears. Since magnet 29 is maintained in a vertically fixed location, albeit allowed to rotate, shaft 4a will act as a lead screw when tended to be rotated by magnet 29 and will effect an axial motion, in this instance a vertical motion.

Inside and outside the tubular body 6b is mounted the drive means 8 for driving the rotating shaft 4b. More specifically, an inside magnet 41 is disposed inside the tubular body 6b. To the lower end portion of the inside magnet 41 is attached (fixed) a rotating cylinder 42 having an axially formed guide slot 42a. The upper end portion of the inside magnet 41 is supported through a ball bearing 44 by a holding cylinder 43 suspended from the upper portion of the tubular body 6b. The holding cylinder 43 is held or fixed between ring 22a and a shoulder formed on flange 6c.

The rotating cylinder 42 is supported through a ball bearing 46 by a bearing member 45 which is supported on annulus 19a and is fitted in the lower end portion of the tubular body 6b. A sliding key 26a fixed on and provided on that portion of the thrust ball bearing coupling 26 which is attached to and rotates with shaft 4b is inserted or received into the guide slot 42a, thus enabling the inside magnet 41 and the rotating cylinder 42 to rotate together and drive shaft 4b. The tubular body 6b is surrounded with an outside magnet 47 in alignment with the inside magnet 41. The outside magnet 47 is supported by bearing members 48 and 49 welded to tubular body 6b and is rotated through ball bearings 50 and 51. To the upper end portion of the outside magnet 47 is fixed a gear 52, which is rotated by a drive motor 54 carried on bearing member 49 through a drive force transmitting means 53 which comprises appropriate gears. The shaft 4b passes freely through magnet 41. The drive path goes from magnet 41 through rotating cylinder 42, through key 26a to thrust bearing coupling 26 and to shaft 4b. Ball bearings 41a are provided between magnet 41 and shaft 4b to avoid interference.

Figure 3:
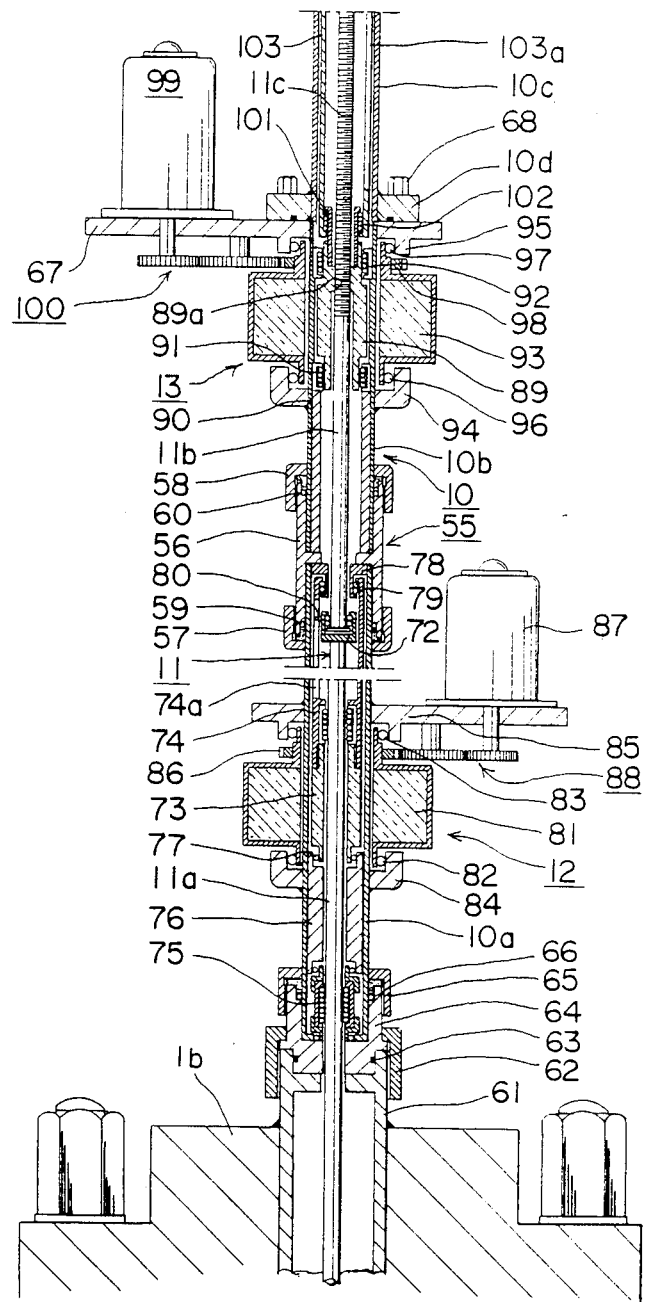
FIG. 3 is a partial longitudinal sectional view of an upper cylinder portion attached to the electric furnace.
Figure 4:
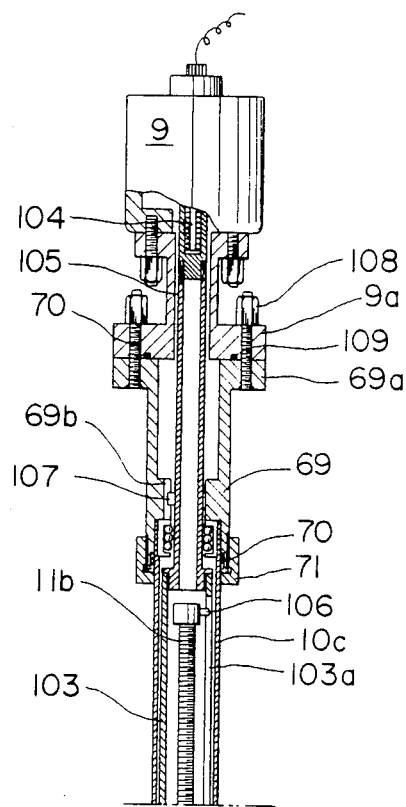
FIG. 4 is a partially sectional view of the remaining portion of the upper cylinder attached to the electric furnace showing the novel weight measuring means.

Referring now to FIGS. 3 and 4, there are illustrated the upper cylinder 10 and the weight measuring means 9. The upper cylinder 10 comprises tubular bodies 10a and 10b which are axially opposed to each other and coupled together hermetically and removably from each other by a coupling means 55. The coupling means 55 comprises a connecting pipe 56 internally threaded and each threadedly connected to external threads on the tubular bodies 10a and 10b, and clamp rings or caps 57 and 58 which are internally threaded and threadedly fitted on the externally threaded ends of connecting pipe 56. By tightening the clamp rings 57 and 58, packings 59 and 60 including O-rings interposed between the connecting pipe 56 and the tubular bodies 10a and 10b are compressed to isolate and hermetically seal the interior of the tubular bodies 10a and 10b from the outside air. Connecting pipe 56 has an internal radially inwardly extending shoulder or flange 56a formed integrally on its interior surface. The tubular body 10a is threadedly engaged at its lower end portion with a connecting cylinder 64. A clamp ring 65 hermetically seals this connection through a packing 66. A boss cylinder 61 having an internal annular shoulder or flange 61a is erected by welding on the top cover 1b of the electric furnace 1. Boss cylinder 61 fits through an opening in cover 1b and receives the connecting cylinder 64 which bears against flange 61a. Hermetic sealing is achieved by clamp ring 62 threaded onto the exterior of cylinder 61 and packing 63.

To the upper end portion of the tubular body 10b is welded a base plate 67. On the base plate 67 is hermetically erected a thin-walled intermediate tubular body 10c of a small diameter. This is accomplished by a flange portion 10d welded to the fore or lower end of the tubular body 10c and attaching this flange 10d to the base plate 67 with bolts 68 through a packing 68a. The intermediate tubular body 10c is formed of the same material as the tubular body 10b. The upper end portion of the intermediate tubular body 10c (see FIG. 4) is threadedly engaged with a connecting pipe 69 having an upper flange portion 69a and is sealed hermetically by a clamp ring 71 threaded onto the outside of tubular body 10c co-acting with a packing 70. A flange portion 9a of the weight measuring means 9 is fixed with bolts 108 to the flange portion 69a of the connecting pipe 69 and a packing 109 is interposed between the flange portions 69a and 9a to provide an hermetic seal against the outside air, as shown in FIG. 4. Flange 9a is also bolted to the main housing 110 of weight measuring means 9 by bolts 111 and maintained gas-tightly packing 112.

Thus, the upper cylinder 10 is completely isolated and sealed from the outside air and is held at the same pressure as that in the electric furnace 1. Even if this internal pressure is very high, the upper cylinder 10 can fully withstand it because of its small reduced diameter.

The single crystal pulling shaft 11 enclosed in the upper cylinder 10 comprises a shaft 11a to be rotatably driven and a shaft 11b to be vertically axially driven, which shafts are coupled together by, for example, a conventional thrust ball bearing coupling 72 just below flange 56a.

Inside and outside the tubular body 10a is mounted the drive means 12 for rotating the shaft 11a. More specifically, in the interior of the tubular body 10a is disposed an inside magnet 73 with the rotating shaft 11a extending freely there-through. Bearings 73a are provided between these elements to minimize interference. On the upper end portion of the inside magnet 73 is fitted (fixed) the lower end of a rotating cylinder 74, whereas the lower end portion of the inside magnet 73 is supported by the upper end of a support pipe 76 through, for example, a ball bearing 77, the support pipe 76 being supported at its lower end by a bearing means 75 provided on the inside bottom of the tubular body 10a and supported by the cylinder 64. Bearing means 75 also enables shaft 11a to rotate freely relative to this lower mounting.

The rotating cylinder 74 is supported at its upper end through a ball bearing 79 by a bearing cylinder 78 which is suspended from the upper end portion of the tubular body 10a and bears against flange 56a. In the rotating cylinder 74 is formed an axial guide slot 74a, into which is inserted a sliding key 80 fixed or formed on that portion of thrust ball bearing coupling 72 which is attached to and rotates with shaft 11a. The tubular body 10a is surrounded with an outside magnet 81 in alignment with the inside magnet 73. The outside magnet 81 is mounted rotatably between bearing members 84 and 85 welded to the tubular body 10a, through ball bearings 82 and 83 which are mounted on lower and upper portions of the outside magnet 81. To a shaft portion of the outside magnet 81 is fixed a gear 86 which is rotated by a drive motor 87 mounted on bearing member 85 through a drive force transmitting means 88 which comprises appropriate gears. Magnet 73 drives shaft 11a via rotating cylinder 74, key 80 and thrust coupling 72.

Inside and outside the tubular body 10b is mounted the drive means 13 for driving the shaft 11b axially and vertically. More specifically, an inside magnet 89 is disposed in the interior of the tubular body 10b. The inside magnet 89 is supported rotatably by a bearing means 91 such as, for example, a ball bearing provided between the inside magnet 89 and a support cylinder 90 mounted on the inside bottom of the tubular body 10b and bearing against flange 56a, and a bearing means 92 such as, for example, a ball bearing mounted on the upper portion of the inside magnet 89 and positioned in the tubular body 10b. The inside magnet 89 is formed with an internal thread portion 89a (preferably a separate element) which threadedly engages an external thread portion 11c formed on the vertically moving shaft 11b to effect the axial movement like a lead screw. The inside magnet 89 is surrounded by and aligned with an outside magnet 93. The outside magnet 93 is rotatably supported by bearing member 94 and welded to tubular portion 10b and depending flange 95 formed on base plate 67 through bearings 96 and 97 such as, for example, ball bearings. On the upper end portion of the outside magnet 93 is mounted a gear 98 which is rotated by a drive motor 99 mounted on base plate 67 through a drive force transmitting means 100 which comprises appropriate gears.

On the upper end portion of the inside magnet 89 is erected (fixed) a bearing cylinder or sleeve 101 with the vertically moving shaft 11b extending therethrough, and as shown in FIG. 3, a suspending cylinder 103 is rotatably connected to the bearing cylinder 101 through, for example, a thrust ball bearing coupling 102. The suspending cylinder 103 is enclosed in a free state in the intermediate tubular body 10c, and as shown in FIG. 4, it is connected to the lower end portion of a suspended shaft 105 whose upper end is fixed to an elastic rod 104 of the weight measuring means 9. The suspending shaft 105 is enclosed in a free condition in the intermediate tubular body 10c. The suspending cylinder 103 is formed with an axially extending guide slot 103a, with which is engaged a sliding key 106 formed on a cap 106a attached to the upper end of the vertically moving shaft 11b, and the suspending shaft 105 with the suspending cylinder 103 attached thereto is engaged through a sliding key 107 with a guide slot 69b formed in a reduced inner diameter section 69c of pipe 69 which interconnects tubular portion 10c with weight measuring means 9.

Therefore, when the interior of the electric furnace is filled with an inert gas of a high pressure, this pressure is applied to the interior of both upper and lower cylinders 10 and 6. The gas tightness is ensured because those cylinders are sealed as previously noted. Also, because the upper and lower cylinders 10 and 6 are thin-walled, but of a small diameter they can fully withstand the internal pressure.

In operation, for vertically moving and rotating the crucible 3, the drive motor 39 is operated and the rotational drive of its output shaft is transmitted to the gear 38 through the drive force transmitting means 40 and the outside magnet 33 is rotated. Consequently, the inside magnet 29 rotates by virtue of the coupling magnetic force. Since the shaft 4a with its external thread portion 4c engages with the internal thread portion 29a, and the sliding key 32 prevents rotation of shaft 4a, shaft 4a moves vertically without rotating depending upon the direction of rotation of drive motor 39. The vertical movements are transmitted through the thrust ball bearing coupling 26 to the shaft 4b, so that the crucible 3 mounted on the upper end of the shaft 4b moves up and down in the interior of the heating means 2 in response to the operation of drive motor 39.

Upon operation of drive motor 54, its rotational drive force is transmitted to the gear 52 through the drive force transmitting means 53 and causes the outside magnet 47 to rotate. Then this rotational force is transmitted to the inside magnet 41 through the thin-walled cylinder 6 by virtue of the magnetic coupling force and causes the magnet 41 to rotate. Consequently, the rotating cylinder 42 also rotates, and the rotating shaft 4b engaged with the rotating cylinder 42 through the sliding key 26a and thrust bearing coupling 26 rotates, thereby causing rotation of the crucible 3 mounted on its upper end. This rotational force is prevented from being transmitted to the shaft 4a by the thrust ball bearing coupling 26. On the other hand, the vertical axial movements of the shaft 4a are transmitted to the shaft 4b, and so the shaft 4b also moves up and down, while its own rotation is not affected or obstructed because the sliding key 26a is in engagement with the guide slot 42a formed in the rotating cylinder 42.

For rotating the single crystal pulling shaft 11, the drive motor 87 is turned ON, whereby the gear 86 is rotated via the drive force transmitting means 88 and the outside magnet 81 is also rotated. Consequently, a magnetic force is transmitted through the thin-walled upper cylinder 10 to the inside magnet 73, and this attactive force causes the inside magnet 73 to rotate, so that the rotating cylinder 74 is rotated together with the inside magnet 73, and in turn rotates shaft 11a via the sliding key 80 engaged with the guide slot 74a and the thrust ball bearing coupling 72. This rotational force is prevented from being transmitted to the shaft 11b by the thrust ball bearing coupling 72.

For driving means shaft 11b vertically, the drive motor 99 is operated and the rotation of its output shaft is transmitted to the gear 98 via the drive force transmitting means 100 and causes the outside magnet 93 to rotate, so that the inside magnet 89 rotates by virtue of a magnetic attraction as mentioned above. The external thread portion 11c of shaft 11b engages with the internal thread portion 89a formed in the inside magnet 89. The rotation of shaft 11b is prevented by the engagement of the sliding key 106 with the guide slot 103a formed in the rotation-prevented suspending cylinder 103, and thus, shaft 11b moves up or down in accordance with the rotating direction of the outside magnet 93 without itself rotating.

Although the suspended cylinder 103 suspends the inside magnet 89, it does not rotate because not only is it connected through the thrust ball bearing coupling 102 to the bearing cylinder 101 which is attached to the inside magnet 89, but also the suspending shaft 105 with the suspending cylinder 103 connected thereto is engaged through the sliding key 107 with the guide slot 69a formed in the connecting cylinder 69. In this way, the single crystal pulling shaft 11 rotates and vertically moves to pull up a single crystal.

The means for measuring the weight of the single crystal being pulled up will now be explained. The suspending cylinder 103 is attached to the connecting shaft 105 which is connected to the elastic rod 104 of the weight measuring mean 9, and the suspending cylinder 103 and the bearing cylinder 101 attached to the inside magnet 89 are coupled together through the thrust ball bearing coupling 102. The inside magnet 89 is suspended by the suspending cylinder 103 and is adapted to rotate in a vertically freely movable state. To this end bearing 92 sits on a shoulder defined by the inside surface of tubular body 10b and its lower end is spaced vertically above the shoulder formed on the upper part of magnet 89 by its reduced section. Therefore, the total weight, including the inside magnet 89, is measured through the vertically moving shaft 11b threadedly engaged with the internal thread portion 89a formed in the inside magnet 89, and the total weight of the related members is subtracted therefrom to obtain crystal weight. In this same fashion, the weight measuring means may be hermetically connected to the lower end side of the lower tubular body for measuring the weight of the crucible. In this case, the suspending cylinder serves as a support cylinder for supporting the inside magnet.

What is claimed is:

1. Crystal pulling apparatus for a single crystal of a compound semiconductor containing a volatile component, including a pressure-resistant electric furnace, a thin-walled cylinder of a hermetically sealed structure having a small diameter and erected hermetically coaxially from said electric furnace, a moving shaft sealed in the interior of said cylinder, said moving shaft comprising a rotating portion and a vertically moving portion which are coupled together so that the rotation of either one does not affect the other, and drive means which utilize a magnetic force and which are disposed inside and outside said cylinder in positions corresponding to said rotating portion and vertically moving portion of said moving shaft, in which an inside magnet of the drive means dispose in the position corresponding to said rotating portion rotates a rotating cylinder connected thereto in an axial direction thereof and having an axially extending guide slot, said rotating portion is in engagement with said guide slot moving portion has an internal thread portion engaged with an through a sliding key and is rotated together with said rotating cylinder, and an inside magnet of the drive means disposed in the position corresponding to said vertically moving portion has an internal thread portion engaged with an external thread portion formed on said vertically moving portion thereby allowing the vertically moving portion to move up and down with rotation of said inside magnet while its rotation is prevented by a sliding key.

2. Crystal pulling apparatus for a single crystal of a compound semiconductor containing a volatile component, including a pressure resistant electric furnace, a pair of thin-walled cylinders of a hermetically sealed structure having a small diameter and extending respectively in upward and downward directions from central portions of top and bottom covers of said electric furnace, a crucible supporting shaft, a single crystal pulling-up shaft, said crucible supporting shaft and said single crystal pulling-up shaft being respectively sealed in said paired cylinders and each comprising a rotating shaft and a vertically moving shaft which are coupled together so that the rotation of either one does not affect the other, and drive means which utilize a magnetic force and which are disposed inside and outside each of said paired cylinders in positions corresponding to said rotating shaft and said vertically moving shaft, in which an inside magnet of the drive means disposed in the position corresponding to said rotating shaft rotates a rotating cylinder provided in an axial direction thereof and having an axially extending guide slot, said rotating shaft is in engagement with said guide slot through a sliding key and is rotated together with said rotating cylinder, and an inside magnet of the drive means disposed in the position corresponding to said vertically moving shaft has an internal thread portion engaged with an external thread portion formed on said vertically moving shaft thereby allowing the vertically moving shaft to move up and down with rotation of said inside magnet while its rotation is prevented by a sliding key.

3. Crystal pulling apparatus for a single crystal of a compound semiconductor containing a volatile component according to claim 1, wherein said cylinder comprises a pair of tubular bodies which are axially opposed to each other and coupled together hermetically and removably from each other, said rotating portion and said vertically moving portion are enclosed respectively in said paired tubular bodies, and said drive means for driving said rotating portion and said vertically moving portion are disposed each inside and outside said tubular bodies in positions corresponding to said rotating portion and said vertically moving portion respectively.

4. Crystal pulling apparatus for a single crystal of a compound semiconductor containing a volatile component, including a pressure-resistant electric furnace, a pair of thin-walled cylinders of a hermetically sealed structure having a small diameter and extending respectively in upward and downward directions from central portions of top and bottom covers of said electric furnace, a weight measuring means attached hermetically to at least an upper one of said paired cylinders, a crucible supporting shaft, a single crystal pulling-up shaft, said crucible supporting shaft and said single crystal pulling-up shaft being sealed respectively in said paired cylinders, and means for suspending said single crystal pulling-up shaft sealed in the upper cylinder, said crucible supporting shaft as well as said single crystal pulling-up shaft and said suspending means being interconnected so that one is not affected by the rotation and vertical movement of the other and being enclosed in tubular bodies which are axially opposed to each other and coupled together hermetically and which constitute said cylinders.

5. Crystal pulling apparatus for a single crystal of a compound semiconductor containing a volatile component according to claim 4, wherein said suspending means suspends an inside magnet without being affected by the rotation of said inside magnet which is disposed around a vertically moving shaft.

6. Crystal pulling apparatus for a single crystal of a compound semiconductor containing a volatile component according to claim 4, wherein said weight measuring means is disposed on the side of the tubular body with said crucible supporting shaft sealed therein for measuring the weight of a crucible.

7. Crystal pulling apparatus for a single crystal of a compound semiconductor containing a volatile component according to claim 2, wherein said cylinders each comprise a pair of tubular bodies which are axially opposed to each other and coupled together hermetically and removably from each other, said rotating shaft and said vertically moving shaft are enclosed respectively in said paired tubular bodies, and said drive means for driving said rotating shaft and said vertically moving shaft are disposed each inside and outside said tubular bodies in positions corresponding to said rotating shaft and said vertically moving shaft respectively.

* * * * *